US012581647B2

(12) United States Patent
Lin et al.

(10) Patent No.: US 12,581,647 B2
(45) Date of Patent: Mar. 17, 2026

(54) MEMORY DEVICE AND METHOD OF MANUFACTURING THE SAME

(71) Applicant: Winbond Electronics Corp., Taichung City (TW)

(72) Inventors: Tsung-Wei Lin, Taichung City (TW); Kun-Che Wu, Taichung City (TW); Chun-Yen Liao, Taichung City (TW); Chun-Sheng Wu, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 685 days.

(21) Appl. No.: 17/958,922

(22) Filed: Oct. 3, 2022

(65) Prior Publication Data

US 2024/0114683 A1 Apr. 4, 2024

(51) Int. Cl.
*H01L 27/11524* (2017.01)
*H10B 41/35* (2023.01)
(52) U.S. Cl.
CPC .................................... *H10B 41/35* (2023.02)

(58) Field of Classification Search
CPC ........ H10B 41/10; H10B 41/35; H10B 41/40; H10B 43/10; H10B 43/35; H10B 43/40; H10B 12/50; H10B 12/488
See application file for complete search history.

(56) References Cited

U.S. PATENT DOCUMENTS 9,093,642 B2 * 7/2015 Okajima ................ H10B 63/80

* cited by examiner

*Primary Examiner* — John A Bodnar
(74) *Attorney, Agent, or Firm* — MUNCY, GEISSLER, OLDS & LOWE, P.C.

(57) ABSTRACT

A method of manufacturing a memory device includes providing a substrate and sequentially forming a stack layer and a hard mask layer on the substrate. The method includes forming a first patterned mandrel and a plurality of second patterned mandrels on the hard mask layer, wherein the first patterned mandrel is adjacent to and spaced apart from an end of the second patterned mandrels in the first direction. The method further includes using the first patterned mandrel and the second patterned mandrels as masks, patterning the hard mask layer and the stack layer sequentially to form a dummy structure and a plurality of word lines separated from each other on the substrate. A portion of the stack layer corresponding to the first mandrel is formed into the dummy structure, and a portion of the stack layer corresponding to the second patterned mandrels is formed into the word lines.

20 Claims, 10 Drawing Sheets

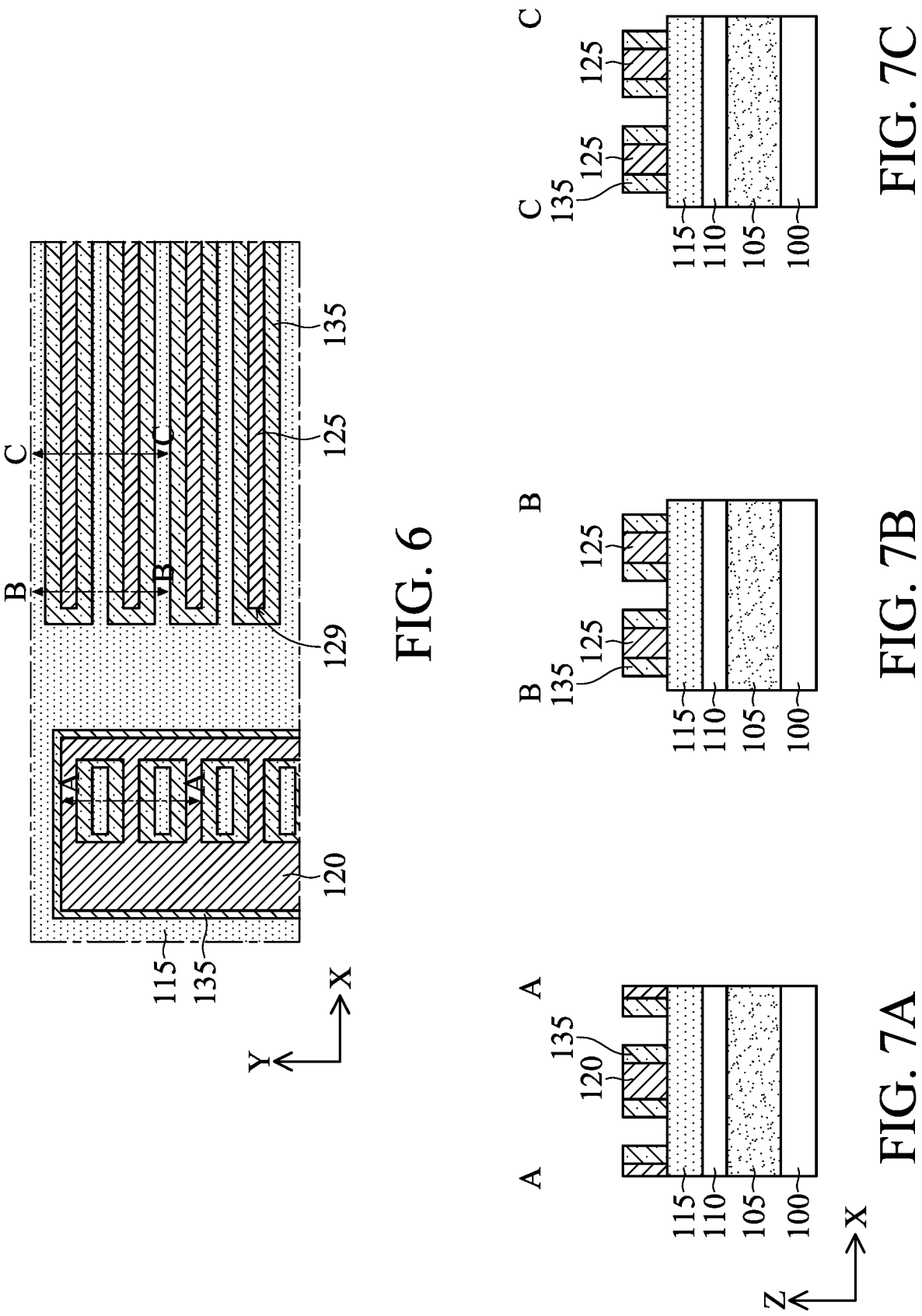

MEMORY DEVICE AND METHOD OF MANUFACTURING THE SAME

BACKGROUND

Technical Field

The present disclosure relates to a semiconductor process technology, and in particular to a method of manufacturing a memory device.

Description of the Related Art

Memory elements are getting smaller, making the lithography process more and more difficult. As the resolution of conventional lithography processes approaches the theoretical limit, vendors have turned to methods such as double-patterning to overcome the optical limit and increase the integration of memory elements. However, using current patterning methods, word lines may bridge with the dummy structure at the word lines' end, affecting the performance of the memory device.

BRIEF SUMMARY

An embodiment of the present disclosure provides a method of manufacturing a memory device. The method includes providing a substrate and sequentially forming a stack layer and a hard mask layer on the substrate. The method includes forming a first patterned mandrel and a plurality of second patterned mandrels on the hard mask layer, wherein the first patterned mandrel is adjacent to and spaced apart from an end of the second patterned mandrels in the first direction. The method includes using the first patterned mandrel and the second patterned mandrels as masks, patterning the hard mask layer and the stack layer sequentially to form a dummy structure and a plurality of word lines separated from each other on the substrate. The portion of the stack layer that corresponds to the first mandrel is formed into the dummy structure, and the portion of the stack layer that corresponds to the second patterned mandrels is formed into the word lines.

Another embodiment of the present disclosure provides a memory device. The memory device includes a substrate. The memory device includes a plurality of word lines disposed on the substrate, wherein the word lines extend in the first direction and are arranged in the second direction, and the first direction intersects the second direction. The memory device includes a dummy structure disposed on the substrate, wherein the dummy structure is adjacent to and spaced apart from an end of the word lines in the first direction, wherein the dummy structure is a bulk body extending in the second direction with a plurality of closed openings arranged in the second direction.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2, 4, 6, 8, 10, 12, 14, 16, and 18 illustrate top views at intermediate stages of manufacturing the memory device according to the embodiments of the present disclosure.

FIGS. 3A, 3B, 3C, 5A, 5B, 5C, 7A, 7B, 7C, 9A, 9B, 9C, 11A, 11B, 11C, 13A, 13B, 13C, 15A, 15B, 15C, 17A, 17B, 17C, 19A, 19B, and 19C illustrate cross-sectional views at intermediate stages of manufacturing the memory device according to the embodiments of the present disclosure.

DETAILED DESCRIPTION

In the semiconductor photolithography process, different wavelengths of light sources affect the exposure accuracy at the edge of the photomask. For example, if a longer wavelength laser light source is selected, it may affect the reflection and imaging of the light at the edges of the photomask, i.e., it will be affected by the optical proximity effect (OPE), resulting in the rounding of the edges of the photoresist pattern, making it difficult to form the correct mask for the lithography process, which will lead to the short circuit of the subsequently formed features. The embodiments of the present disclosure use layout decomposition to reduce the effect of the optical proximity effect, thereby forming features not affected by the optical proximity effect.

Figure 1:
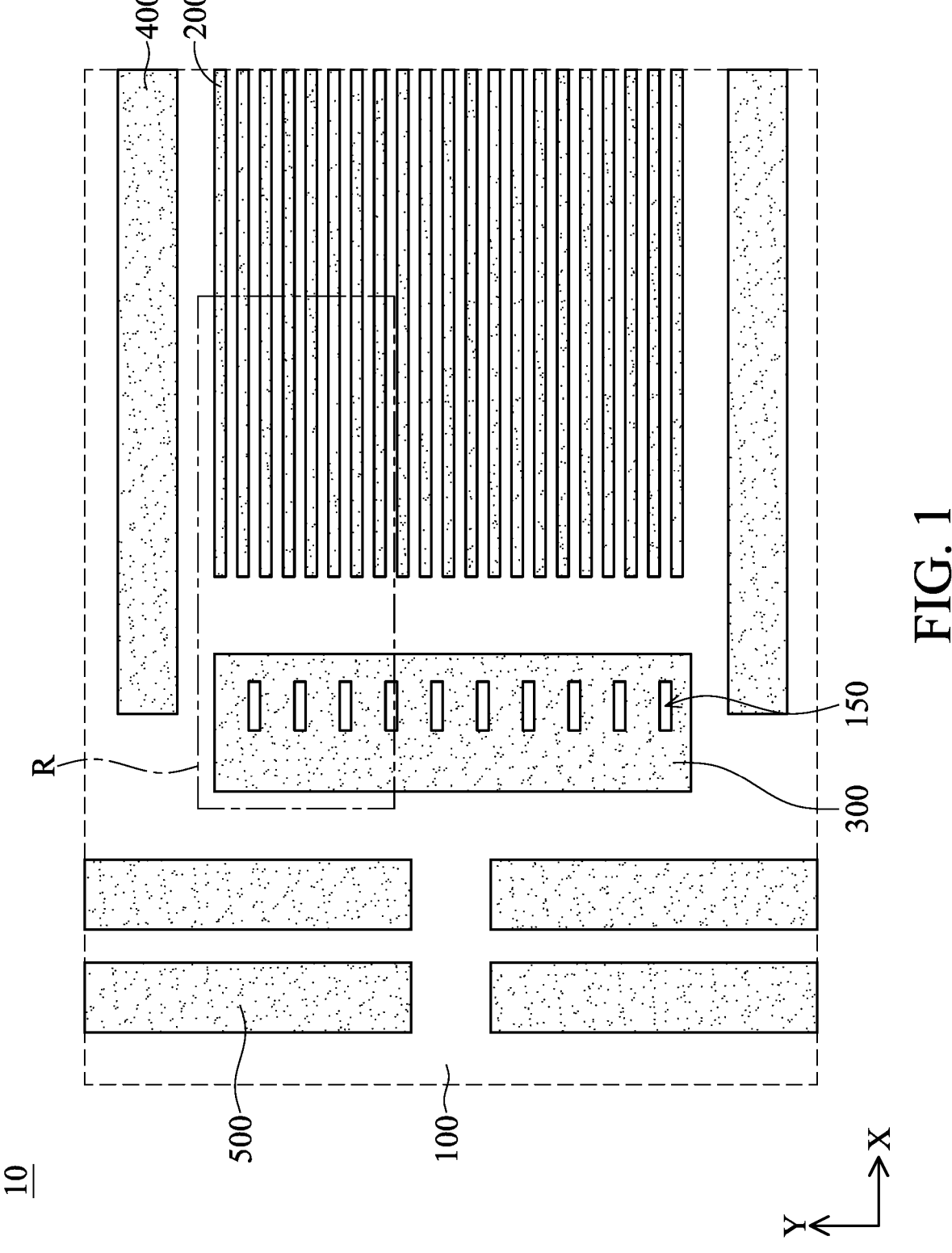
FIG. 1 illustrates a partial top view of the memory device according to the embodiments of the present disclosure.

FIG. 1 illustrates a partial top view of the memory device according to the embodiments of the present disclosure. The memory device 10 includes a plurality of word lines 200. The word lines 200 are disposed on the substrate 100. The word lines 200 extend in the first direction (e.g., along a coordinate axis X) and are arranged in the second direction (e.g., along a coordinate axis Y), and the first direction intersects the second direction. In some embodiments, the first direction is perpendicular to the second direction. In some embodiments, the ratio of the pitch of the word lines 200 to the width of the word lines 200 is about 1:1.

The memory device 10 further includes a dummy structure 300. The dummy structure 300 is disposed on the substrate 100. The dummy structure 300 is adjacent to and spaced apart from an end of the word lines 200 in the first direction (e.g., adjacent to and spaced apart from the end of the word lines 200 in the coordinate axis X direction). The dummy structure 300 may avoid uneven width of the end portion of the word lines 200 due to the loading effect of the etching process. The dummy structure 300 is a bulk body extending in the second direction and having a plurality of closed openings 150 arranged in the second direction. Throughout the present disclosure, "closed opening" means that in the top view, the holes are completely surrounded by solid material (as opposed to "opening", where at least one side of the opening is connected to outside). In conventional processes, light sources with longer wavelengths may cause rounding of the corners of the photoresist pattern due to the optical proximity effect, and after the etching process, the dummy structure 300 and the word lines 200 may bridge due to the narrow separation distance between both of them. However, in the embodiment of the present disclosure, since the dummy structure 300 and the word lines 200 are already spaced apart from each other during the patterning of the layout definition, the bridging between the word lines 200 and the dummy structure 300 may be avoided in the subsequent forming process, and the spacing of the word lines 200 and the dummy structure 300 may be adjusted according to design requirements. In some embodiments, the dummy structure 300 is rail-shaped. In some embodiments, the dummy structure 300 is a floating structure, and the dummy structure 300 is not connected to an external circuit. In some embodiments, the space between the dummy structure 300 and the word lines 200 is from about 50 nm to about 110 nm.

The memory device 10 includes two select gates 400, respectively disposed on opposite sides of the word lines 200 in the second direction (e.g., on opposite sides of the coordinate axis Y direction). The two select gates 400 extend in the first direction (e.g., extend along the coordinate axis X direction), and the dummy structure 300 is between the two select gates 400 in the second direction (e.g., between the two selection gates 400 in the coordinate axis Y direction). It should be appreciated that FIG. 1 is merely a partial top view of the memory device 10, therefore the number of the select gates 400 is not limited to two, the number of the select gates 400 depends on the number of sets of the word lines 200 and the dummy structure 300, and each of the sets of word lines 200 and dummy structure 300 may have two corresponding select gates 400. In some embodiments, the memory device 10 includes a plurality of landing pads 500, which serve as pick up for the word lines 200. Landing pad 500 extends in the second direction (e.g., extends along the coordinate axis Y direction) and is arranged in the first direction (e.g., arranged in the coordinate axis X direction), the landing pads are respectively connected to another plurality of word lines 200 (not shown), and the dummy structure 300 is between the landing pads 500 and the word lines 200.

FIGS. 2, 4, 6, 8, 10, 12, 14, 16, and 18 illustrate top views at intermediate stages of manufacturing the memory device according to the embodiments of the present disclosure.

Figures 2, 3A, 3B, 3C:
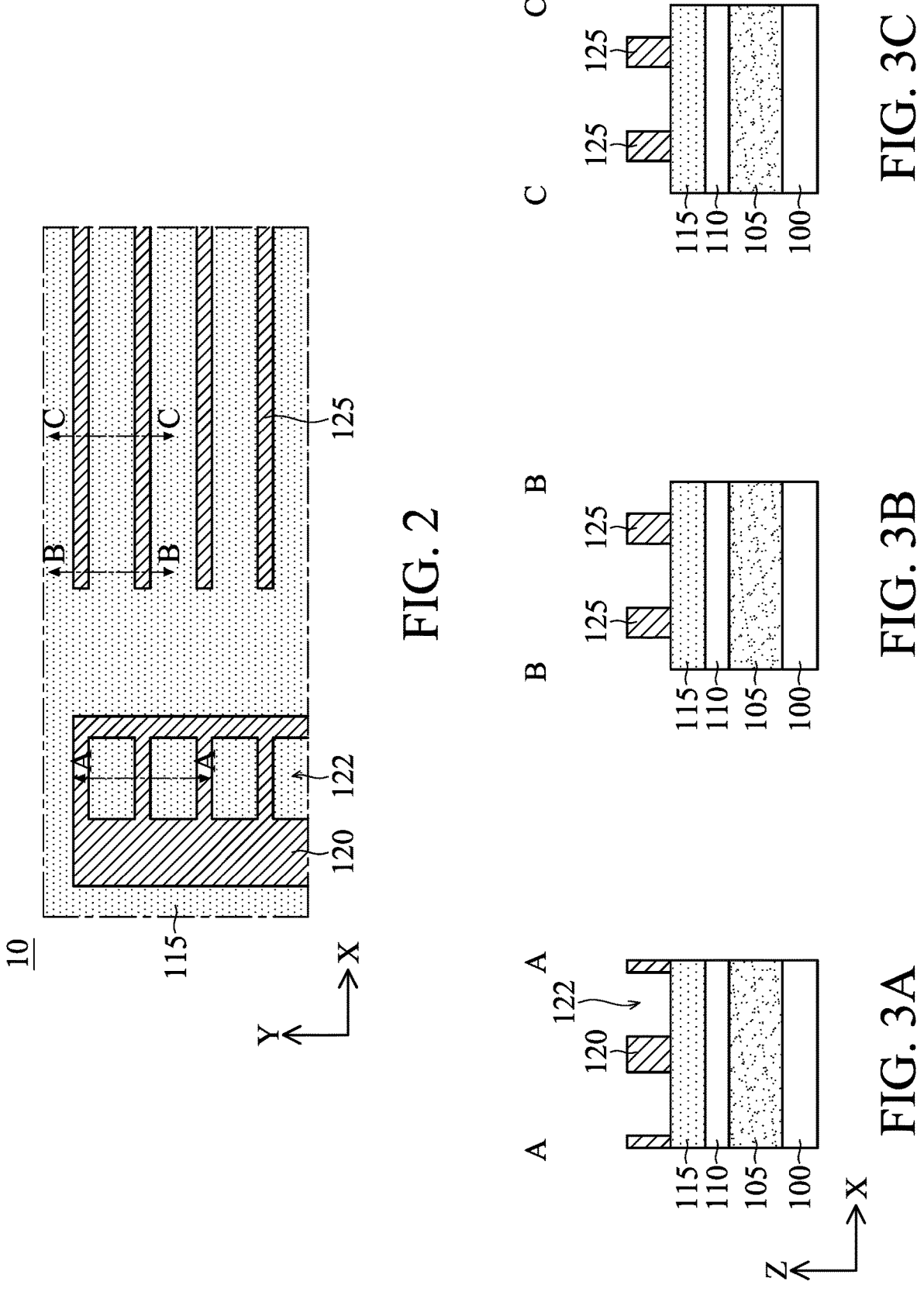

Referring first to the top view of FIG. 2, accompanied with the cross-sectional views of FIGS. 3A, 3B and 3C, illustrate a step for forming the patterned mandrel. FIG. 2 illustrates an enlarged top view of a region R corresponding to the memory device 10 in FIG. 1 according to the embodiments of the present disclosure. FIGS. 3A, 3B, and 3C illustrate cross-sectional views corresponding to the line A-A, the line B-B, and the line C-C in FIG. 2, respectively, in accordance with the embodiments of the present disclosure. In the embodiments of the present disclosure, provides a substrate 100. In some embodiments, the substrate 100 may be an elemental semiconductor substrate, such as silicon substrate, or germanium substrate; a compound semiconductor substrate, such as silicon carbide (SiC), gallium arsenide (GaAs), indium arsenide (InAs), or indium phosphide (InP) substrate; or an alloy semiconductor substrate, such as SiGe, SiGeC, GaAsP, or GaInP. A stack layer 105, a sacrificial layer 110, and a hard mask layer 115 are sequentially formed on the substrate 100. First, the stack layer 105 is formed on the substrate 100. The stack layer 105 is a film stacked in a third direction (e.g., in the coordinate axis Z direction), and the third direction intersects the first direction and the second direction. In some embodiments, the third direction is perpendicular to the first direction, and the third direction is perpendicular to the second direction. In some embodiments, the stack layer 105 may sequentially include, in the third direction from bottom to top, for example, a tunnel dielectric layer, a floating gate layer, an inter-gate dielectric layer, a control gate layer, a metal layer, and the top capping layer. For the sake of simplicity, each of the layers mentioned above is not shown in detail and is only shown schematically by the stack layer 105. In some embodiments, the material of the tunnel dielectric layer may be silicon oxide. In some embodiments, the material of the patterned floating gate layer may be a conductive material, such as doped polysilicon, undoped polysilicon, or a combination thereof. In some embodiments, the inter-gate dielectric layer may be a composite layer constructed by, for example, oxide/nitride/oxide (ONO), but the present disclosure is not limited to it, the composite layer may include five or more layers of films. In some embodiments, the material of the control gate layer may be a conductive material, such as doped polysilicon, undoped polysilicon, or a combination thereof. In some embodiments, the material of the metal layer may be such as W, TiN, or a combination thereof. In some embodiments, the material of the top capping layer may be a dielectric material, such as silicon nitride, silicon oxynitride, or a combination thereof.

Next, the sacrificial layer 110 and the hard mask layer 115 are sequentially formed on the stack layer 105. The sacrificial layer 110 protects the stack layer 105 from the etching process during the subsequent patterning process of the hard mask layer 115. The hard mask layer 115 may serve as a patterned mask for the stack layer 105 in subsequent process steps to form the word lines 200 and the dummy structure 300. In some embodiments, the material of the sacrificial layer 110 includes silicon oxide. In some embodiments, the hard mask layer 115 may be a single-layer or multi-layer structure. In some embodiments, the material of the hard mask layer 115 includes polysilicon.

A first patterned mandrel 120 and a plurality of second patterned mandrels 125 are formed on a hard mask layer 115, and the first patterned mandrel 120 is adjacent to and spaced apart from an end of the second patterned mandrels 125 in the first direction (e.g., the coordinate axis X). In the conventional patterning process for forming the word lines, a plurality of patterned mandrels are usually formed with the ends connected to each other, and after performing the pattern transfer process of the mandrels, the pattern is spaced apart by another patterning process so that the connected portion at the ends of the patterned mandrels become the pattern of the dummy structure, and the remaining portions of the patterned mandrels become the pattern of the word lines. In the embodiment of the present disclosure, the patterns of the mandrels corresponding to the formation of the word lines 200 and the dummy structure 300 are already spaced apart from each other in the step of forming the patterned mandrels, i.e., using layout decomposition, effectively avoiding the incomplete separation of the patterns caused by the subsequent process. The first patterned mandrel 120 extends in the second direction and has a plurality of closed openings 122 arranged in the second direction (e.g., extending in the coordinate axis Y direction and having a plurality of closed openings 122 arranged in the coordinate axis Y direction), while the second patterned mandrels 125 extends in the first direction and is arranged in the second direction (e.g., extending in the coordinate axis X direction and arranged in the coordinate axis Y direction). In some embodiments, the first patterned mandrel 120 and the second patterned mandrels 125 are formed by first forming a mandrel layer (not shown) on the hard mask layer 115 and forming a photoresist pattern on the mandrel layer by photolithography and etching process. In some embodiments, after forming the photoresist pattern, a trimming process may be performed to further reduce the width of the photoresist pattern, followed by an etching process to transfer the photoresist pattern to the mandrel layer, thereby forming the first patterned mandrel 120 and the second patterned mandrels 125. In some embodiments, the material of the first patterned mandrel 120 and the second patterned mandrels 125 may include carbon, silicon nitride (SiON), bottom anti-reflective coating (BARC), or a combination thereof. In some embodiments, the ratio of the width of the closed openings 122 in the second direction to the pitch of the second patterned mandrels 125 is about 1:1. The ratio of the width of the closed openings 122 in the second direction to the width of the second patterned mandrels 125 in the second direction is about 3:1. The space between the first patterned mandrel 120 and the second patterned mandrels 125 is about 50 nm to about 110 nm.

Figures 4, 5A, 5B, 5C:
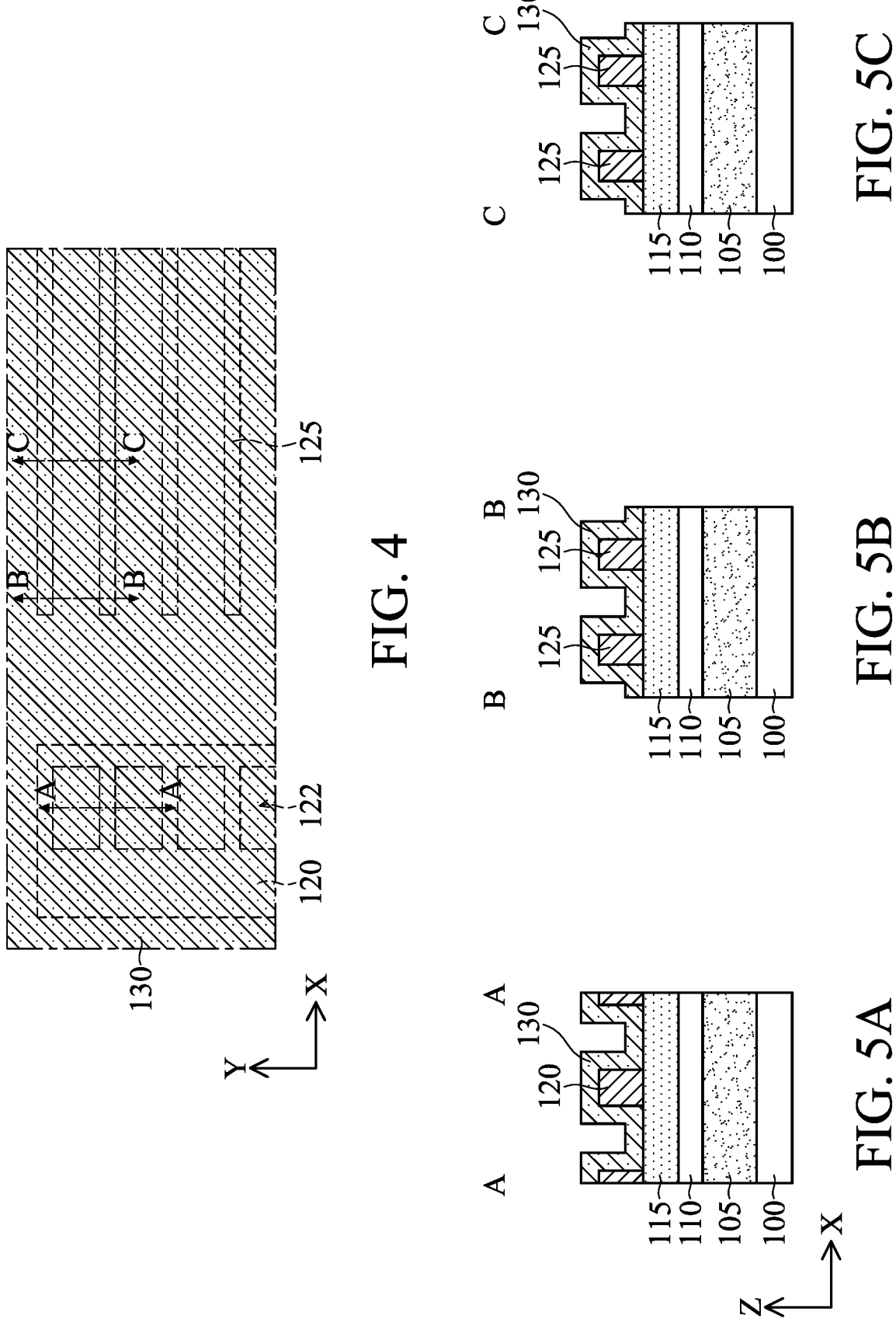
Figures 8, 9A, 9B, 9C:
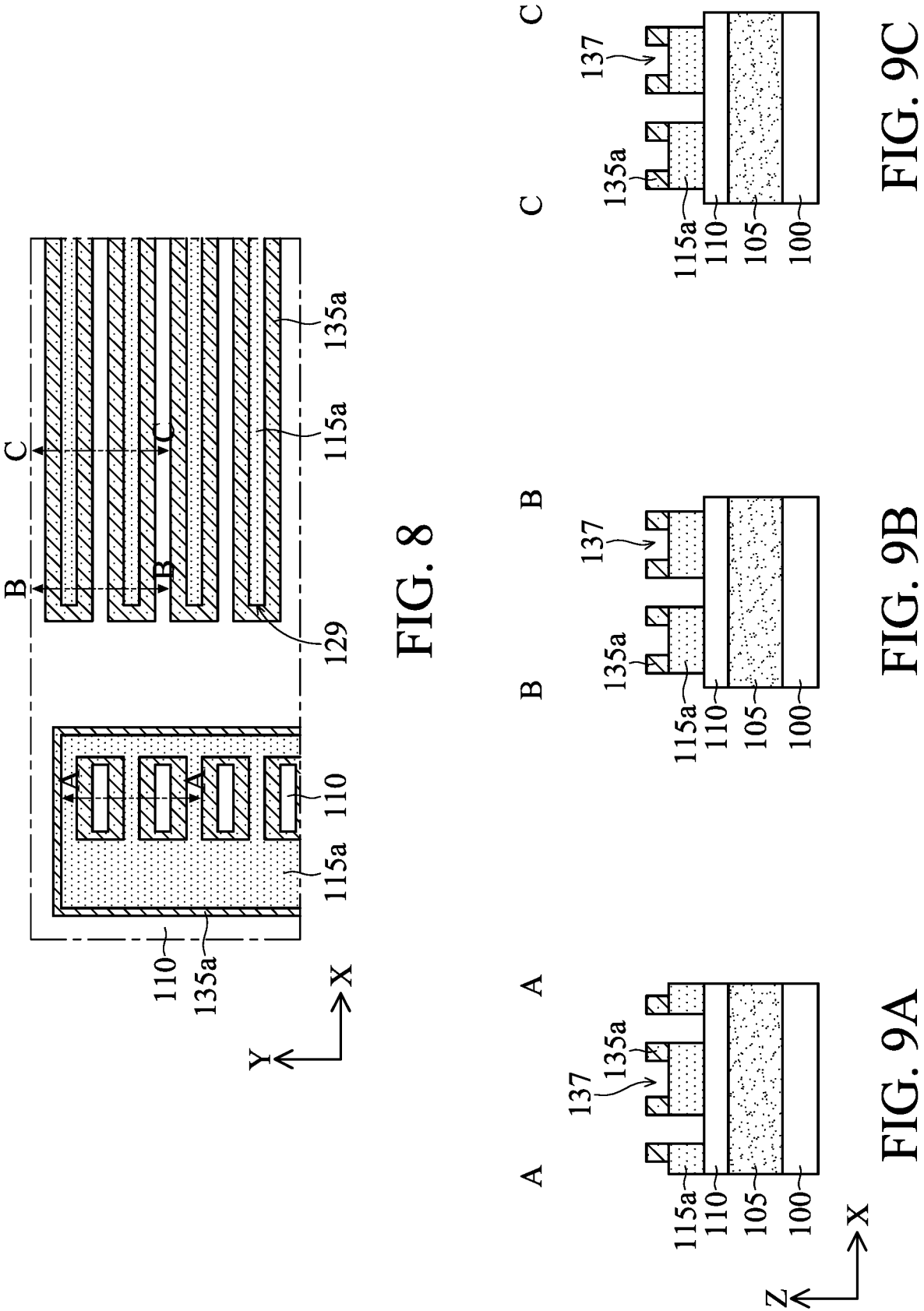

Referring to the top views of FIGS. 4, 6 and 8 and the cross-sectional views of FIGS. 5A, 5B, 5C, 7A, 7B, 7C, 9A, 9B and 9C, after forming the first patterning mandrel 120 and the second patterning mandrels 125, a self-alignment double patterning (SADP) process is performed to form a plurality of spacers 135 on the hard mask layer 115. Referring first to FIGS. 4, 5A, 5B, and 5C, a spacer material layer 130 is conformally formed on the hard mask layer 115, the first patterning mandrel 120, and the second patterning mandrels 125. In some embodiments, the spacer material layer 130 may be formed by, for example, chemical vapor deposition (CVD) or atomic layer deposition (ALD). In some embodiments, the material of the spacer material layer 130 may be oxide, such as silicon oxide (SiO).

Then, referring to FIGS. 6, 7A, 7B and 7C, after forming the spacer material layer 130, the self-aligned double patterning process further includes performing an etching-back process on the spacer material layer 130 until top surfaces of the first patterning mandrel 120 and the second patterning mandrels 125 and a portion of the top surface of the hard mask layer 115 are exposed, thereby forming a plurality of spacers 135 on opposite sidewalls of the first patterning mandrel 120 and the second patterning mandrels 125. The spacers 135 are connected at an end 129 of the second patterned mandrels 125, as shown in FIG. 6.

Referring next to FIGS. 8, 9A, 9B, and 9C, after forming the spacers 135, the self-aligned double patterning process further includes transferring the patterns of the first patterned mandrel 120, the second patterned mandrels 125, and the spacers 135 to the hard mask layer 115, thereby forming a plurality of patterned hard mask layers 115a. In some embodiments, during the etching process of transferring the patterns of the first patterned mandrel 120, the second patterned mandrels 125, and the spacers 135, the patterns of the first patterned mandrel 120 and the second patterned mandrels 125 may be removed simultaneously and portions of the spacers 135 (which are spacers 135a) may be remained. After forming the spacers 135a, the top surface of a portion of the sacrificial layer 110 and the top surface of a portion of the hard mask layer 115a are exposed, as shown in FIGS. 9A, 9B, and 9C. By removing the first patterned mandrel 120 and the second patterned mandrels 125, the spacers 135a forms a recessed region 137 above the hard mask layer 115a and exposes the top surface of the hard mask layer 115a, i.e., the top surface of the spacers 135a is above the top surface of the hard mask layer 115a.

Figures 10, 11A, 11B, 11C:
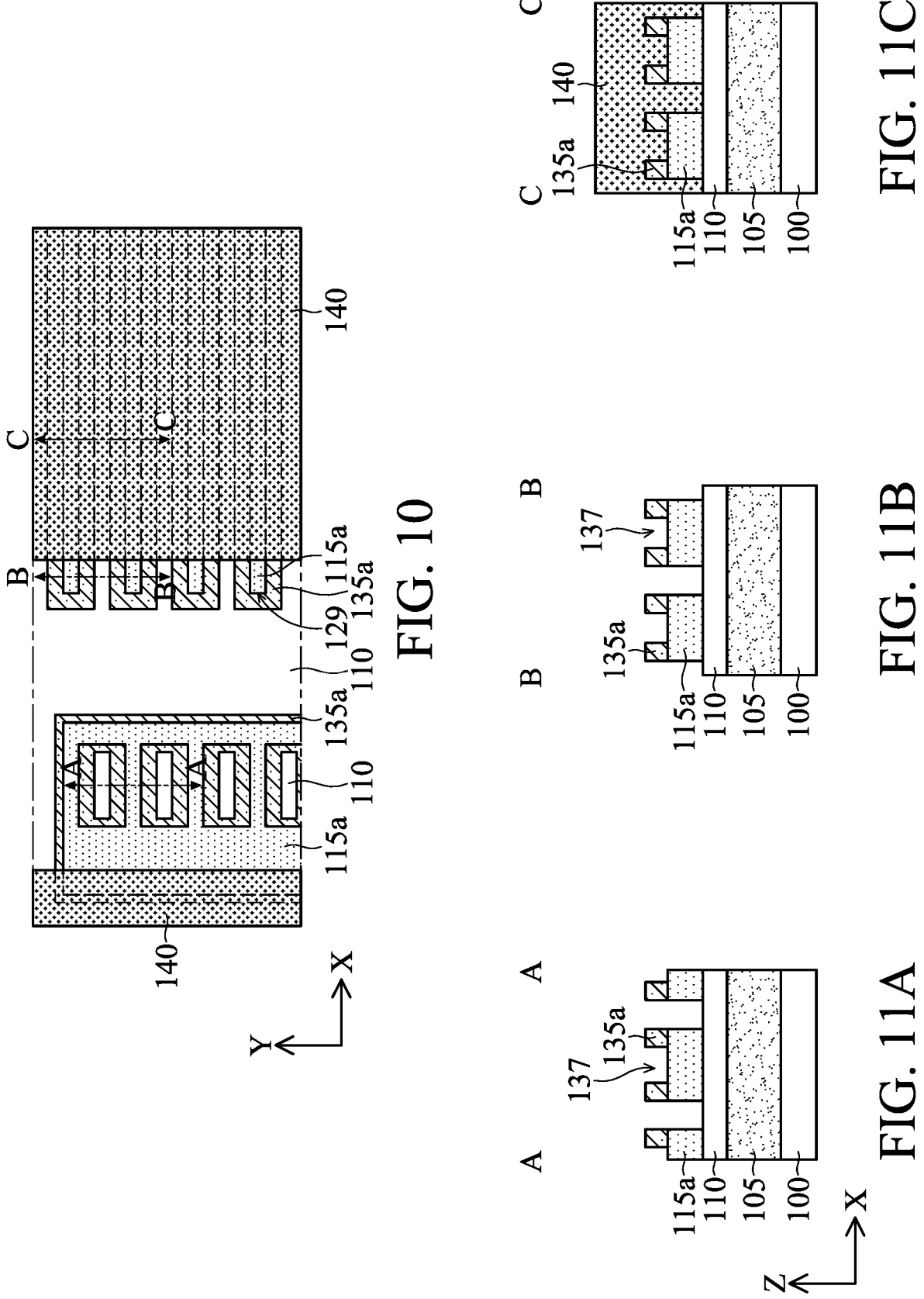
Figures 12, 13A, 13B, 13C:
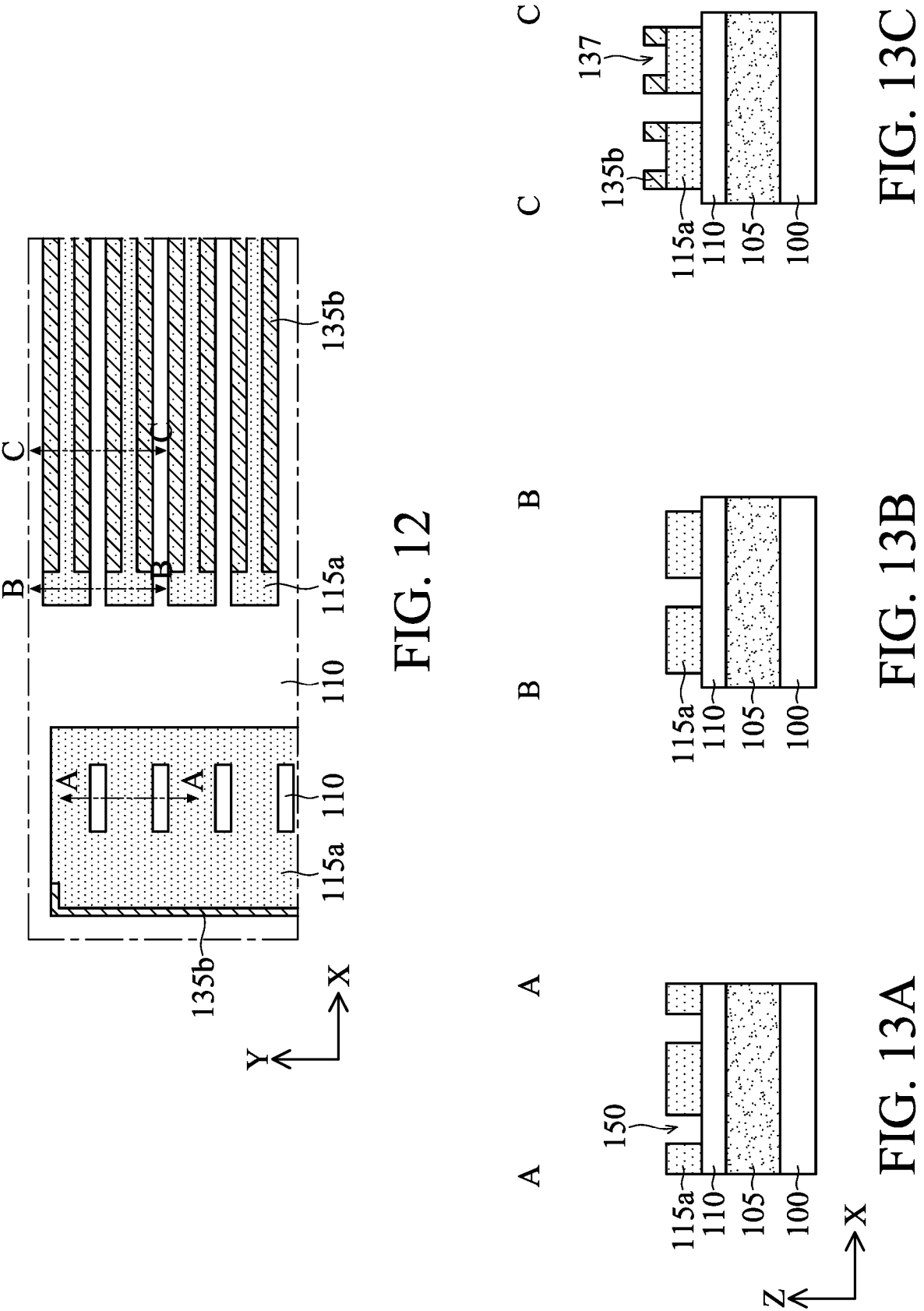

Referring to the top views of FIGS. 10 and 12 and the cross-sectional views of FIGS. 11A, 11B, 11C, 13A, 13B, and 13C, a cutting process of the spacers 135a is performed to form a plurality of spacers spaced apart from each other. The cutting process includes forming a first patterned photoresist 140 covering a portion of the spacers 135a, i.e., covering the portion of the spacers 135a formed on opposite sidewalls of the second patterned mandrels 125 in the second direction (e.g., the coordinate axis Y direction), and exposing the portion of the spacers 135a adjacent to the end 129 of the second patterned mandrels 125. The first patterning photoresist 140 exposes at least a portion of the spacers 135a formed on the first patterning mandrel 120. In some embodiments, the first patterned photoresist 140 exposes the spacers 135a in the regions corresponding to the line A-A and the line B-B, but covers the spacers 135a in the region corresponding to the line C-C, including filling into the recessed region 137 in the region corresponding to the line C-C, as shown in FIGS. 11A, 11B, and 11C. Then, portions of the spacers 135a not covered by the first patterned photoresist 140 are removed, thereby forming a plurality of spacers 135b, as shown in FIG. 12. The removed portions includes a connecting portion of the spacers 135a at the end 129 of the second patterned mandrels 125 and an exposed portion formed on the first patterned mandrel 120. After the cutting process, a plurality of spacers 135b are formed and are not connected to each other. The spacers 135b extend in the first direction and are arranged in the second direction. In some embodiments, as shown in FIGS. 13A, 13B, and 13C, the spacers 135a in the regions corresponding to the line A-A and the line B-B are removed to re-expose the hard mask layer 115a, which was previously being partially covered by the spacers 135a, and the region corresponding to the line A-A further exposes the closed openings 150, while the spacers 135b in the region corresponding to the line C-C is remained and used as the pattern for the word lines formed subsequently. In some embodiments, the width of the spacers 135b in the second direction is equal to the spacing of the spacers 135b in the second direction.

Figures 14, 15A, 15B, 15C:
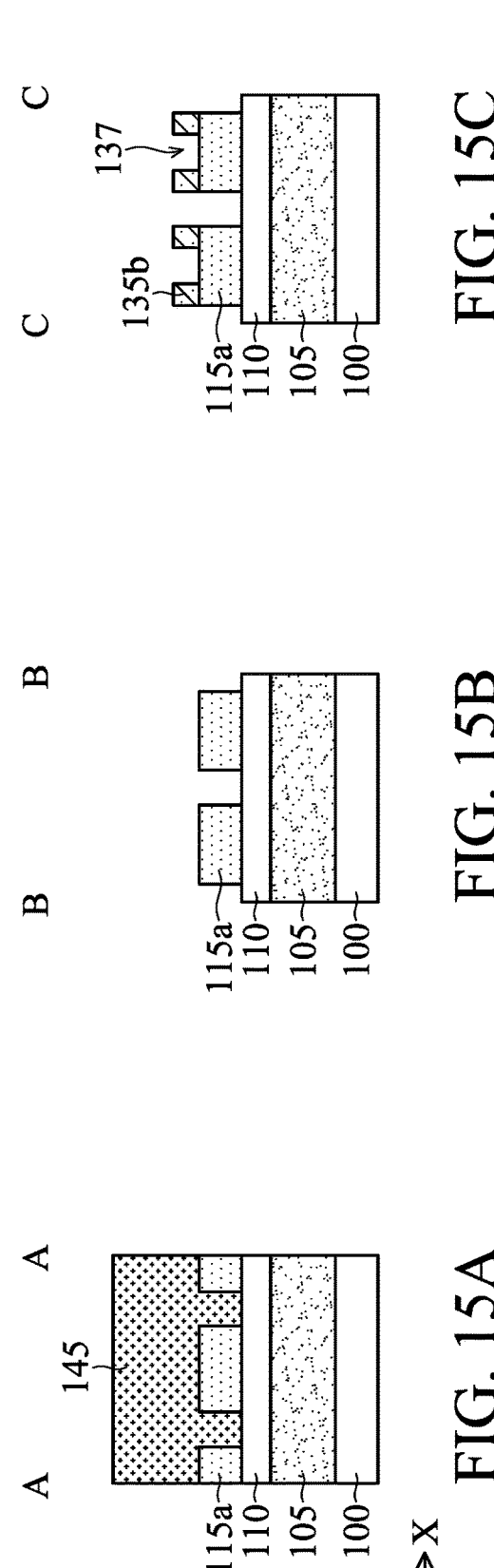
Figures 16, 17A, 17B, 17C:
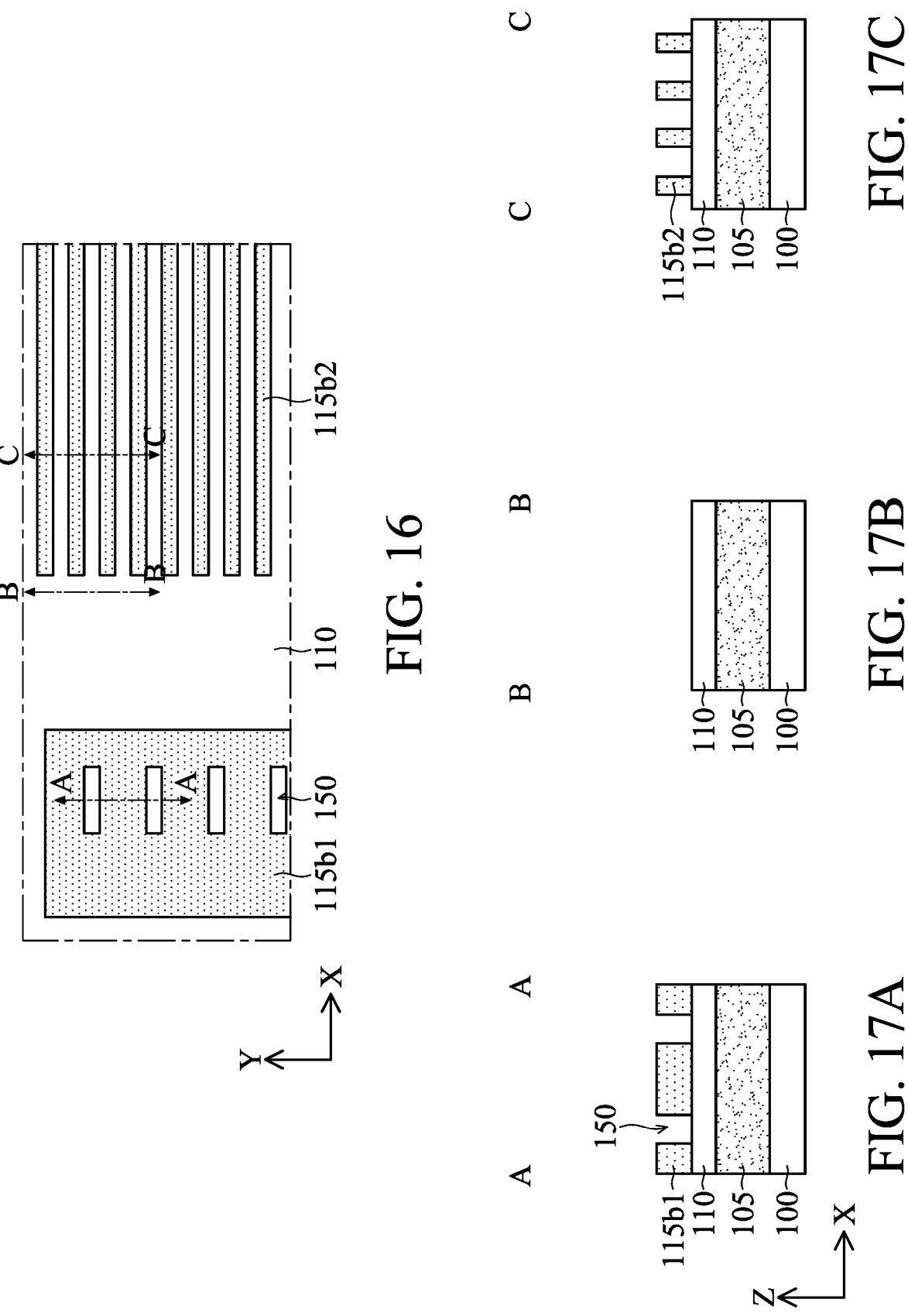
Figures 18, 19A, 19B, 19C:
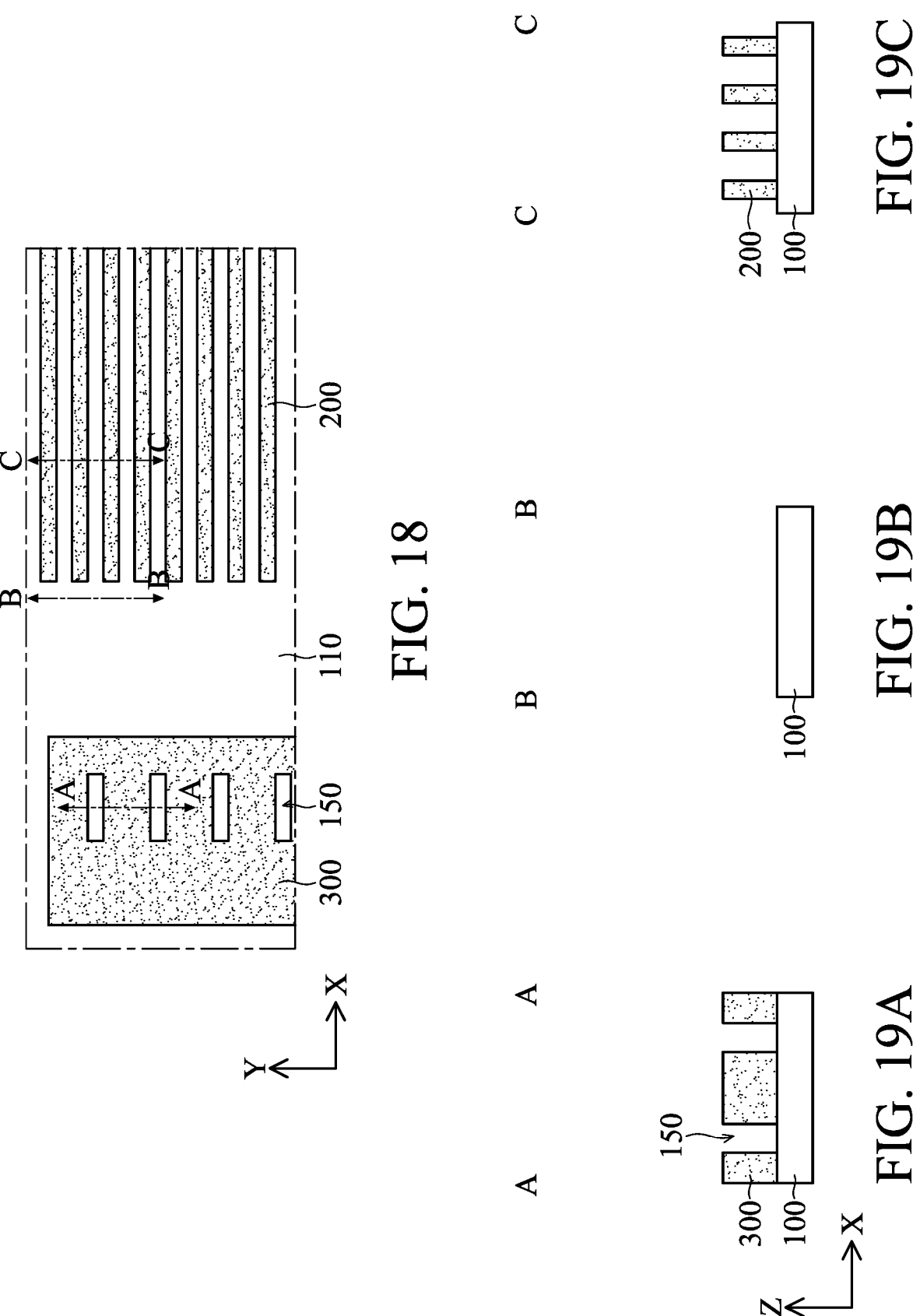

Further, referring to the top views of FIGS. 14, 16, and 18 and the cross-sectional views of FIGS. 15A, 15B, 15C, 17A, 17B, 17C, 19A, 19B, and 19C, transferring the pattern of spacers 135b to the hard mask layer 115a, the sacrificial layer 110, and the stack layer 105 sequentially. First, referring to FIG. 14, the pattern transfer process includes forming a second patterned photoresist 145 to cover all portions of the hard mask layer 115a corresponding to the first patterned mandrel 120, and expose the spacers 135b corresponding to the second patterned mandrels 125. In some embodiments, the second patterned photoresist 145 covers the hard mask layer 115a in the region corresponding to the line A-A, while the hard mask layer 115a in the region corresponding to the line B-B, the hard mask layer 115a in the region corresponding to the line C-C, and the spacers 135b are exposed, as shown in FIGS. 15A, 15B, and 15C.

It should be appreciated that an edge 147 of the photoresist pattern may be affected by the optical proximity effect, thereby forming the second patterned photoresist 145 with rounded edges 147. However, in the embodiment of the present disclosure, since the regions for subsequent formation of the dummy structure 300 and the word lines 200 are already defined by the first patterned mandrel 120 and the second patterned mandrels 125, the second patterned photoresist 145 with rounded edges 147 does not cause bridging between the dummy structure 300 and the word lines 200, and increasing the process margin for pattern transfer process.

Referring to FIG. 16, subsequently transfer the pattern of the spacers 135b to the hard mask layer 115a below the spacers 135b, and the second patterned photoresist 145 and all of the spacers 135b are removed, thereby forming the hard mask layer 115b1 corresponding to the first patterned mandrel 120 (which used as a mask to form the dummy structure 300) and forming the hard mask layer 115b2 corresponding to the second patterned mandrels 125 (which used as a mask to form the word lines 200). In some embodiments, the spacers 135b in the region corresponding to the line A-A is completely removed and leaving the hard mask layer 115b1 exposing the closed openings 150, the hard mask layer 115a in the region corresponding to the line B-B is completely removed and exposing the top surface of the sacrificial layer 110, and the region corresponding to the line C-C is left with the patterned hard mask layer 115b2, as shown in FIGS. 17A, 17B and 17C. In some embodiments, since the closed openings 150 is the region defined by the closed openings 122 after the formation of the spacers 135, the closed openings 122 may be greater than the closed openings 150.

Next, using the hard mask layer 115*b*1 and the hard mask layer 115*b*2 as masks, transfers the pattern of the hard mask layer 115*b*1 (the pattern for performing the double patterning with the first patterned mandrel 120) and the pattern of the hard mask layer 115*b*2 (the pattern for performing the double patterning and the cutting process with the second patterned mandrels 125) to the sacrificial layer 110 and the stack layer 105 sequentially, followed by removing the hard mask layer 115*b*1, the hard mask layer 115*b*2, and the sacrificial layer 110, so as to form the dummy structure 300 and the word lines 200 on the substrate 100, as shown in FIG. 18. The pattern of the hard mask layer 115*b*1 correspondingly forms the dummy structure 300, and the pattern of the hard mask layer 115*b*2 correspondingly forms the word lines 200. In some embodiments, the dummy structure 300 is rail-shaped, which is a bulk body extending in the second direction (e.g., a bulk body extending in the coordinate axis Y direction), and has the closed openings 150 arranged in the second direction (e.g., the closed openings 150 arranged in the coordinate axis Y direction). In some embodiments, the region corresponding to the line A-A is formed as a dummy structure 300 exposing the closed openings 150, the sacrificial layer 110 and the stack layer 105 in the region corresponding to the line B-B are completely removed and exposing the top surface of the substrate 100, and the region corresponding to the line C-C using the hard mask layer 115*b*2 as a mask to form the word lines 200, as shown in FIGS. 17A, 17B, and 17C. In the embodiments using self-aligning double patterning, a ratio of the width of the closed openings 150 in the second direction to the pitch of the word lines 200 is about 1:1. In other embodiments using self-aligning quadruple patterning, the ratio of the width of the closed openings 150 in the second direction to the pitch of the word lines 200 is about 2:1. In some embodiments, the spacing of the closed openings 150 in the second direction is greater than the width of the word lines 200.

After forming the word lines 200 and the dummy structure 300, other semiconductor processes may be performed to form various features and elements of the memory device, which will not be repeated herein.

As mentioned above, the embodiment of the present disclosure spaces apart the word lines region and the dummy region of the memory device during the process of defining the pattern of the word lines, so that the resulting word lines may not be affected by the subsequent optical proximity effect and the resulting word lines may not bridge with the dummy structure, which increases the process margin for the pattern transfer process and thus maintains the yield of the memory device. In addition, since the resulting word lines are not affected by the optical proximity effect, the photolithography process performed in the embodiment of the present disclosure may appropriately select light sources with other wavelengths, thereby reducing the manufacturing cost of the memory device and maintaining the performance of the memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a memory device, comprising:

providing a substrate;

sequentially forming a stack layer and a hard mask layer on the substrate;

forming a first patterned mandrel and a plurality of second patterned mandrels on the hard mask layer, wherein the first patterned mandrel is adjacent to and spaced apart from an end of the second patterned mandrels in a first direction; and using the first patterned mandrel and the second patterned mandrels as masks, patterning the hard mask layer and the stack layer sequentially to form a dummy structure and a plurality of word lines separated from each other on the substrate, wherein a portion of the stack layer corresponding to the first mandrel is formed into the dummy structure, and a portion of the stack layer corresponding to the second patterned mandrels is formed into the word lines, wherein the dummy structure is adjacent to and spaced apart from an end of the word lines in the first direction, wherein the dummy structure is a bulk body extending in a second direction with a plurality of first closed openings arranged in the second direction.

2. The method as claimed in claim 1, wherein the first patterned mandrel extends in the second direction and comprises a plurality of second closed openings, and the second patterned mandrels extend in the first direction and are arranged in the second direction, wherein the first direction intersects the second direction.

3. The method as claimed in claim 2, wherein a ratio of a width of each of the second closed openings in the second direction to a pitch of the second patterned mandrels is about 1:1, and a ratio of the width of each of the second closed openings in the second direction to a width of each of the second patterned mandrels in the second direction is about 3:1.

4. The method as claimed in claim 1, wherein sequentially patterning the hard mask layer and the stack layer to form the word lines comprises:

forming a plurality of spacers on opposite sidewalls of the second patterned mandrels;

transferring a pattern of the second patterned mandrels and a pattern of the spacers to the hard mask layer and removing the second patterned mandrels, while leaving the spacers on the hard mask layer; and sequentially transferring the pattern of the spacers to the hard mask layer and the stack layer to form the word lines on the substrate.

5. The method as claimed in claim 4, wherein forming the spacers further comprises: forming a connecting portion of the spacers at the end of the second patterned mandrels, and after removing the second patterned mandrels, the method further comprises:

forming a first patterned photoresist covering a portion of the spacers on the opposite sidewalls of the second patterned mandrels, while exposing the connecting portion of the spacers at the end of the second patterned mandrels; and removing the connecting portion of the spacers at the end of the second patterned mandrels, so that remaining portions of the spacers are not connected to each other.

6. The method as claimed in claim 5, wherein the remaining portions of the spacers are arranged in the second direction, the first direction intersects the second direction, and a width of each of the spacers in the second direction is equal to a spacing of the spacers in the second direction.

7. The method as claimed in claim 4, wherein sequentially transferring the pattern of the spacers to the hard mask layer and the stack layer comprises:

forming a second patterned photoresist covering a portion of the hard mask layer corresponding to the first patterned mandrel while exposing the spacers;

transferring the pattern of the spacers to the hard mask layer underlying the spacers;

removing the second patterned photoresist and the spacers; and transferring a pattern of the hard mask layer to the stack layer to form the word lines on the substrate.

8. The method as claimed in claim 1, wherein before forming the hard mask layer on the stack layer, the method further comprises:

forming a sacrificial layer on the stack layer, the sacrificial layer protects the stack layer from etching during the patterning of the hard mask layer.

9. The method as claimed in claim 8, wherein the hard mask layer comprises polysilicon, and the sacrificial layer comprises silicon oxide.

10. The method as claimed in claim 1, wherein the dummy structure is rail-shaped, wherein the first direction intersects the second direction.

11. The method as claimed in claim 10, wherein a spacing of the first closed openings in the second direction is greater than a width of each of the word lines.

12. The method as claimed in claim 1, wherein a spacing between the first patterned mandrel and the second patterned mandrels is about 50 nm to about 110 nm.

13. A memory device, comprising:

a substrate;

a plurality of word lines disposed on the substrate, wherein the word lines extend in a first direction and are arranged in a second direction, and the first direction intersects the second direction; and a dummy structure disposed on the substrate, wherein the dummy structure is adjacent to and spaced apart from an end of the word lines in the first direction, wherein the dummy structure is a bulk body extending in the second direction with a plurality of closed openings arranged in the second direction.

14. The memory device as claimed in claim 13, wherein the dummy structure is rail-shaped.

15. The memory device as claimed in claim 13, further comprising:

two select gates respectively disposed on opposite sides of the word lines in the second direction, wherein the two select gates extend in the first direction, and the dummy structure is between the two select gates in the second direction.

16. The memory device as claimed in claim 13, further comprising:

a plurality of landing pads that extend in the second direction, respectively connected with another plurality of word lines, wherein the dummy structure is between the landing pads and the word lines.

17. The memory device as claimed in claim 13, wherein a ratio of a width of each of the closed openings in the second direction to a pitch of the word lines is about 1:1.

18. The memory device as claimed in claim 13, wherein a spacing between the dummy structure and the word lines is about 50 nm to about 110 nm.

19. The memory device as claimed in claim 13, wherein a spacing of each of the closed openings in the second direction is greater than a width of each of the word lines.

20. The memory device as claimed in claim 13, wherein a ratio of a width of each of the closed openings in the second direction to a pitch of the word lines is about 2:1.

\*    \*    \*    \*    \*